United States Patent [19]

Azam et al.

[11] 4,110,623

[45] Aug. 29, 1978

[54] DEVICE FOR SCANNING A TARGET WITH A BEAM OF CHARGED PARTICLES

[75] Inventors: Guy Azam; Claude Perraudin, both of Buc, France

[73] Assignee: CGR-MeV, Paris, France

[21] Appl. No.: 768,907

[22] Filed: Feb. 15, 1977

[30] Foreign Application Priority Data

Feb. 17, 1976 [FR] France ................. 76 04346

[51] Int. Cl.² ............................................. G01K 1/08
[52] U.S. Cl. ..................... 250/398; 250/492 B; 313/35
[58] Field of Search ............... 250/398, 492 B; 313/35

[56] References Cited

U.S. PATENT DOCUMENTS

| 2,602,751 | 7/1952 | Robinson | 313/35 |
| 2,816,231 | 10/1957 | Nygard | 250/492 B |
| 2,858,442 | 10/1958 | Dewey | 250/398 |
| 3,371,206 | 2/1968 | Takizawa | 250/398 |

Primary Examiner—Harold A. Dixon
Attorney, Agent, or Firm—Oblon, Fisher, Spivak, McClelland & Maier

[57] ABSTRACT

A device for furnishing a scanning beam intended for irradiating a target, the irradiating dose level having a predetermined distribution on the target. The device comprises a main magnetic system having a plurality of polepieces for scanning the charged particle beam and a secondary magnetic system having a plurality of polepieces and being located upstream of the main magnetic system for variably offsetting the beam entering the main magnetic system. In a preferred embodiment the main and secondary magnetic systems are provided with quadripoles with respective coils which are supplied in pairs with signals $S_{X1}$, $S_{Y1}$, and $S_{X2}$, $S_{Y2}$, the signals $S_{X1}$, $S_{Y1}$ being for example of "sawtooth" waveform and those $S_{X2}$, $S_{Y2}$ of "squarewave" waveform. The signals may be co-phasal or in phase-opposition.

10 Claims, 10 Drawing Figures

DEVICE FOR SCANNING A TARGET WITH A BEAM OF CHARGED PARTICLES

BACKGROUND OF THE INVENTION

The present invention relates to a device for scanning a target with a beam of charged particles, the device enabling the irradiating dose level received by the target to be modified in a predetermined manner.

A scanning beam is produced by subjecting a beam of charged particles to the influence of an electric field or magnetic field whose amplitude is a time-variable function, the variations generally being periodic in nature (alternating sinusoidal or sawtooth field for example). If the beam of particles in subjected to a magnetic field produced by a bi-polar electromagnet, scanning is obtained along a straight line whilst if the electromagnet is of the quadripolar kind, the beam can scan an area. However, it should be pointed out that the position occupied by the particle beam at the entrance to the quadripole device, in relation to the latter's axis, determines the distribution of the radiation dose level received by the target. In other words, any eccentricity in the beam at the entrance to the scanning quadripole device, introduces a modulation in the dose level from one edge of the target to the other, the target being disposed perpendicularly to the axis of the quadripole device and being centered in relation thereto.

It is therefore possible to modulate the radiation dose received by a target, in a predetermined manner, by arranging for the beam to be eccentric at the entrance to the scanning quadripole device.

SUMMARY OF THE INVENTION

It is an object of the invention to provide a device for scanning a target by means of a beam of charged particles on both sides of an axis ZZ, said device comprising a main magnetic scanning system of axis ZZ having a plurality of polepieces, each of said polepieces being associated with a coil, said main scanning system being associated with a secondary magnetic system of axis ZZ and located upstream of said main system, for variably offsetting said beam before entering said main magnetic system, said secondary magnetic system having a plurality of polepieces, means being provided for applying to the coils of said main and secondary systems, electrical signals which have predetermined characteristics.

BRIEF DESCRIPTION OF THE DRAWING

For a better understanding of the invention and to show how the same may be carried into effect, reference will be made to the drawings accompanying the ensuing description in which.

DESCRIPTION OF THE PREFERRED EMBODIMENTS

Figure 1:
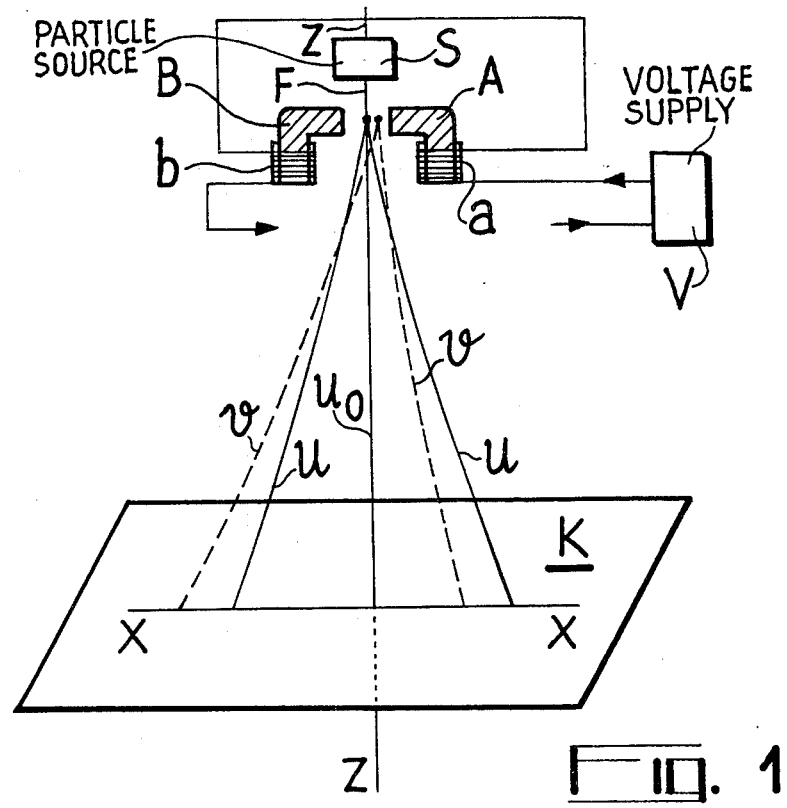
FIGS. 1 and 2 respectively illustrate the figure scanned by a beam which in the one case is centered and in the other is eccentrically positioned in relation to the axis ZZ of a scanning system, and also illustrate the variation in the radiation dose level obtained, using these respective beams, on a target disposed perpendicularly to the axis ZZ of this scanning system.

FIG. 1 illustrates a source S of charged particles emitting a particle beam F which is subjected to the action of a variable magnetic field created between the two polepieces A and B of an electromagnet, the polepieces respectively being associated with coils $a$ and $b$ connected to a voltage source V furnishing a signal of predetermined form.

If the beam F is centered on the axis ZZ of the scanning device, it can scan a target K disposed perpendicularly to said axis ZZ, along a straight line XX, the distribution of the radiation dose level being substantially constant. If, at the entrance to the scanning system, the beam F is disposed eccentrically in relation to the axis ZZ, the distribution of the radiation dose level, or in other words density, on the straight line XX is modulated and this modulation is a function of the eccentricity of the beam F.

The scanning beam obtained from a beam F centered on the axis ZZ has been shown in full line in FIG. 1 and that obtained from the eccentric beam has been shown in broken line (respectively beams $u$ and $v$).

Figure 2:
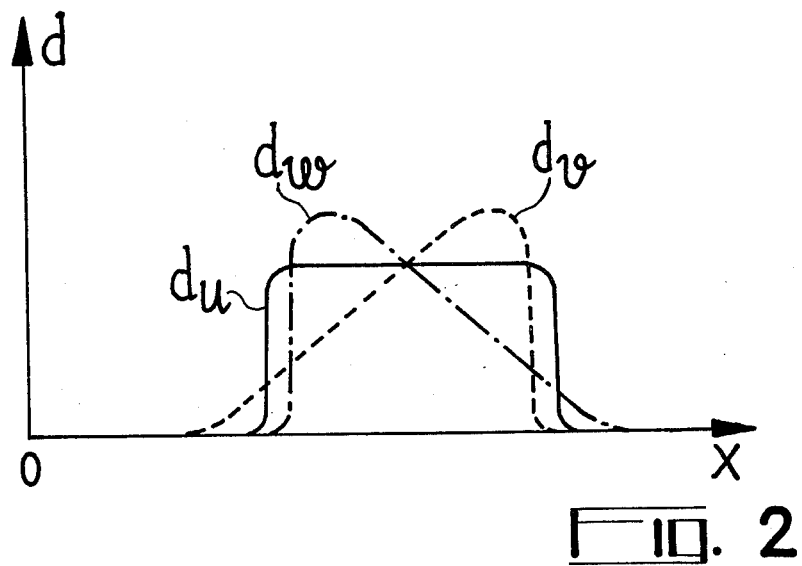

FIG. 2 illustrates the distribution in dose level, $d_u$ and $d_v$ obtained on the target K for each of the beams $u$ and $v$.

If the beam F has an eccentricity which is symmetrical to that indicated earlier, then a dose level distribution $d_w$ which is symmetrical to that $d_v$ will be obtained.

Figure 3:
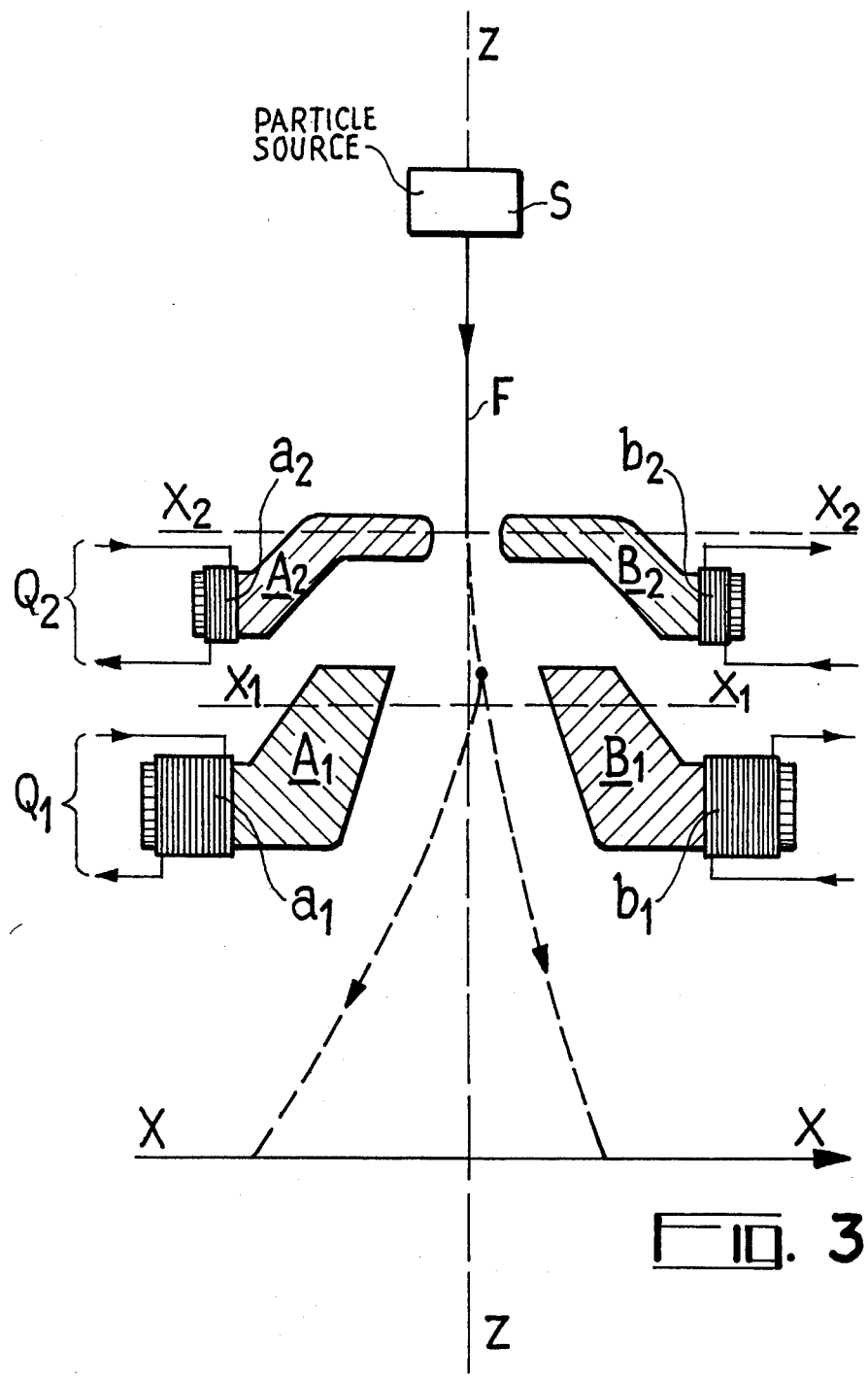
FIG. 3, in section, illustrates an example of a scanning device in accordance with the invention.
Figure 4:
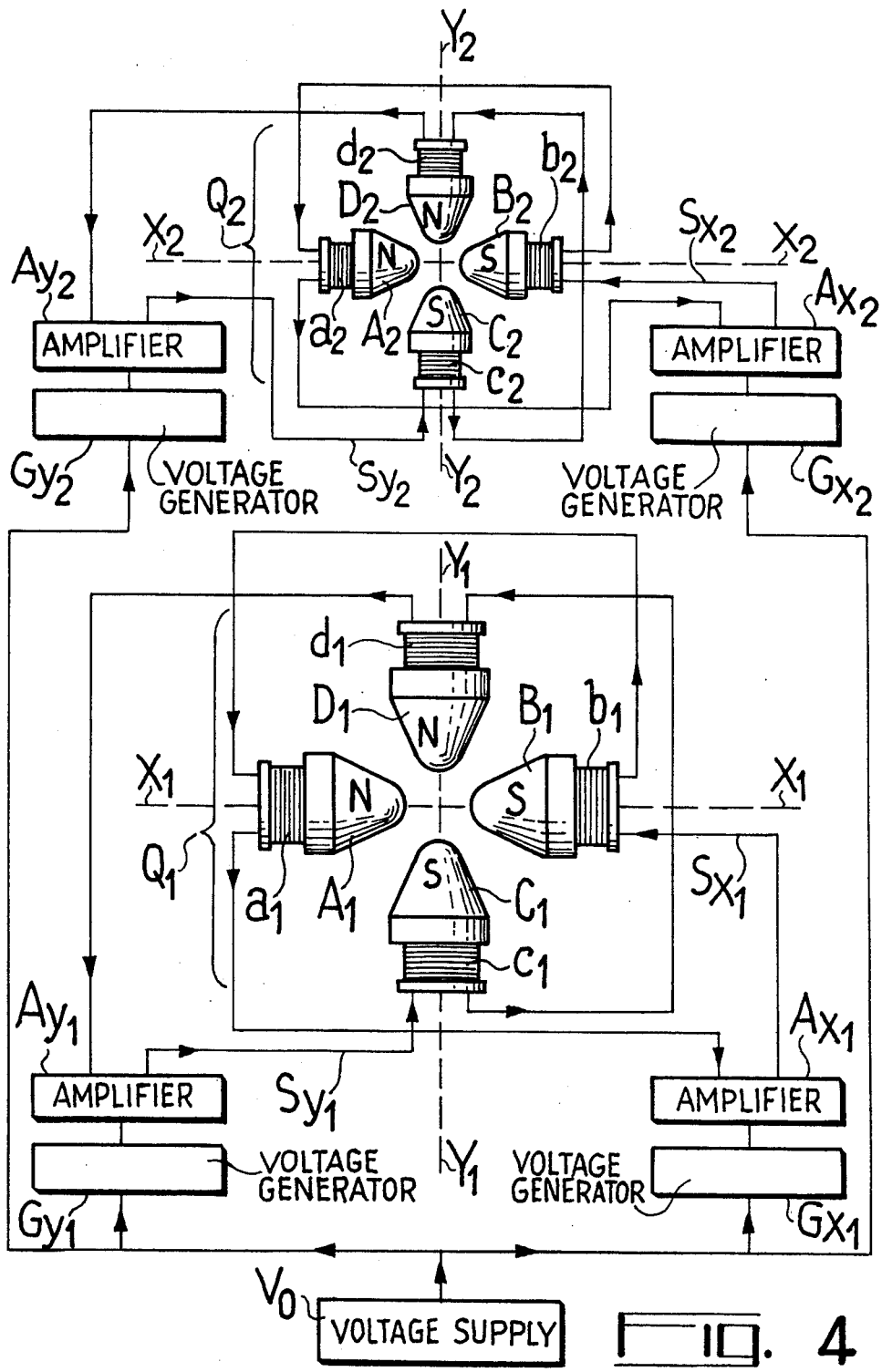
FIG. 4 schematically illustrates the supply circuits of the main and second magnetic systems of the scanning device in accordance with the invention.

The scanning device in accordance with the invention, shown in section in FIG. 3, enables the irradiation dose level received by the target K to be modulated in a predetermined manner by offsetting the radiation beam by respect with axis ZZ before it is subjected to the scanning signals proper. In this embodiment, the scanning device in accordance with the invention comprises a main magnetic scanning system so called main quadripole system $Q_1$ having four polepieces $A_1$, $B_1$, $C_1$, $D_1$, respectively equipped with coils $a_1$, $b_1$, $c_1$, $d_1$, supplied in pairs ($a_1$, $b_1$ and $c_1$, $d_1$) from a voltage source V. Associated with this main quadripole system $Q_1$ there is a secondary magnetic system so called secondary quadripole system $Q_2$ having four polepieces $A_2$, $B_2$, $C_2$, $D_2$, respectively equipped with coils $a_2$, $b_2$, $c_2$, $d_2$, (only the polepieces $A_1$, $B_1$ and $A_2$, $B_2$ and their respective coils $a_1$, $b_1$ and $a_2$, $b_2$, are visible in fact in FIG. 3). An example of an arrangement for supplying these coils $a_1$, $b_1$; $c_1$, $d_1$ and $a_2$, $b_2$; $c_2$, $d_2$ has been shown schematically in FIG. 4. The supply arrangement comprises a control voltage source $V_o$ associated with:

A voltage generator $G_{X1}$ for the channel $X_1$ of the main quadripole systems $Q_1$, this channel $X_1$ corresponding to the polepieces $A_1$, $B_1$ located on the axis $X_1$, $X_1$ of the main system $Q_1$;

A voltage generator $G_{Y1}$ associated with the polepieces $C_1$, $D_1$ (channel $Y_1$ disposed on the axis $Y_1Y_1$ of the main system $Q_1$);

Two amplifiers $A_{X1}$ and $A_{Y1}$;

A voltage generator $G_{X2}$ associated with the pair of polepieces $A_2$ and $B_2$, corresponding to the channel $X_2$, located along the axis $X_2X_2$ of the secondary system $Q_2$;

A voltage generator $G_{Y2}$ associated with the pair of polepieces $C_2$, $D_2$, corresponding to the channel $Y_2$, located along the axis $Y_2Y_2$ of the secondary system $Q_2$; and Two amplifiers $A_{X2}$ and $A_{Y2}$.

Figure 5:
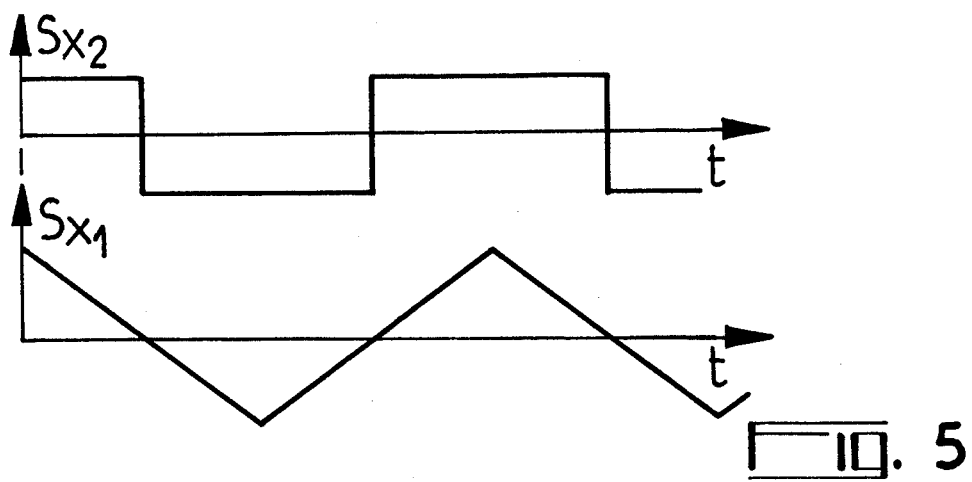
FIG. 5 illustrates an example of two electrical signals which can be applied simultaneously to the coils of the main magnetic system and to the coils of the secondary magnetic system.
Figure 6:
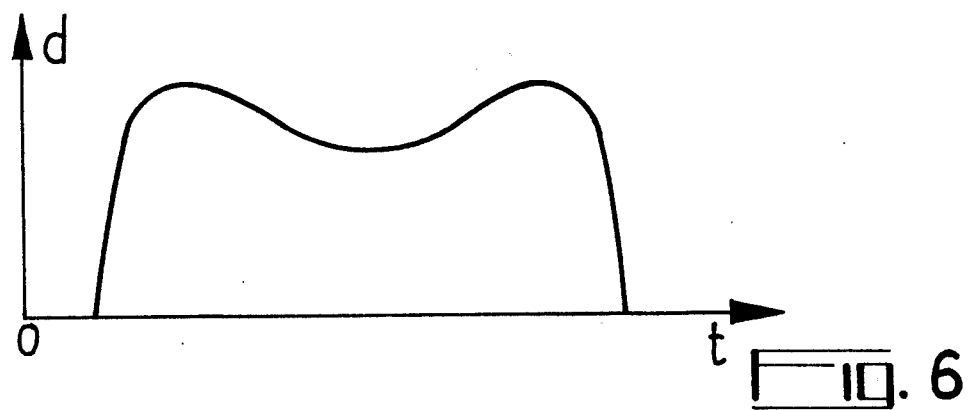
FIG. 6 illustrates the variation in the radiation dose level obtained on a target when electrical signals of the kind shown in FIG. 5 are used.

In operation, the two voltage generators $G_{X1}$ and $G_{Y1}$ create two signals $S_{X1}$ and $S_{Y1}$ (sawtooth signals for example) whose amplitudes are proportional to the control voltage $V_o$. The periodicities of the oscillations in the channels $X_1$ and $Y_1$ may differ from one another and be in a given ratio to each other. The signals $S_{X1}$ and $S_{Y1}$ are applied respectively to the coils $a_1$, $b_1$, $c_1$, $d_1$ after amplification in the amplifiers $A_{X1}$ and $A_{Y1}$. Simultaneously, the voltage generators $G_{X2}$ and $G_{Y2}$ create two signals $S_{X2}$ and $S_{Y2}$ (squarewave signals for example) which are applied, after amplification in the amplifiers $A_{X2}$ and $A_{Y2}$, to the coils $a_2$, $b_2$ and $c_2$, $d_2$ of the secondary system $Q_2$. FIG. 5, by way of non-limitative example, illustrates signals $S_{X1}$ and $S_{X2}$ which can be applied respectively to the pairs of coils $a_1$, $b_1$ and $a_2$, $b_2$. Signals $S_{Y1}$ and $S_{Y2}$ respectively similar to those $S_{X1}$ and $S_{Y2}$, are applied to the two other pairs of coils $c_1$, $d_1$ and $c_2$, $d_2$. In FIG. 6, the distribution of the radiation dose level received by a target K has been shown, the radiation beam F being subjected to the magnetic field developed by the signals $S_{X2}$, $S_{Y2}$ applied to the secondary quadripole system $Q_2$, and then to the magnetic scanning field developed by the signals $S_{X1}$ and $S_{Y1}$.

Figure 7:
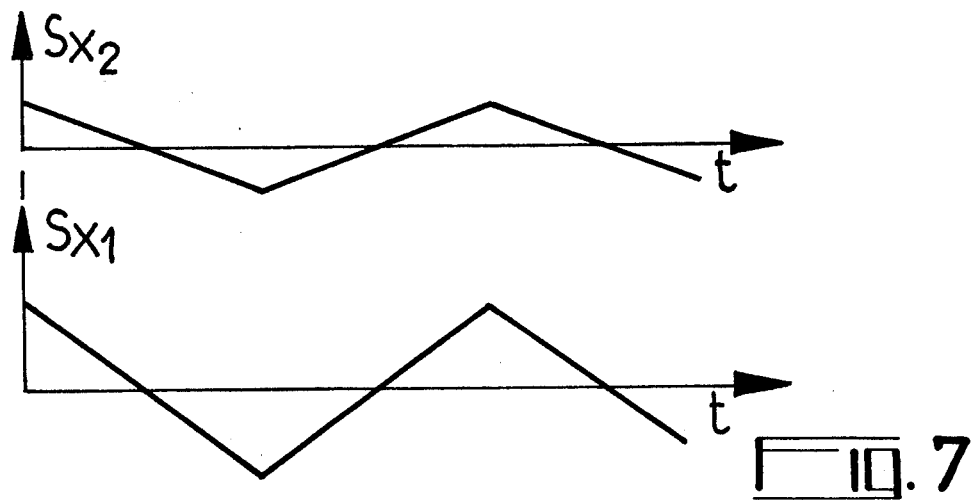
FIGS. 7 and 9 respectively illustrate two other pairs of signals which can be applied to the main and secondary magnetic systems.
Figure 8:
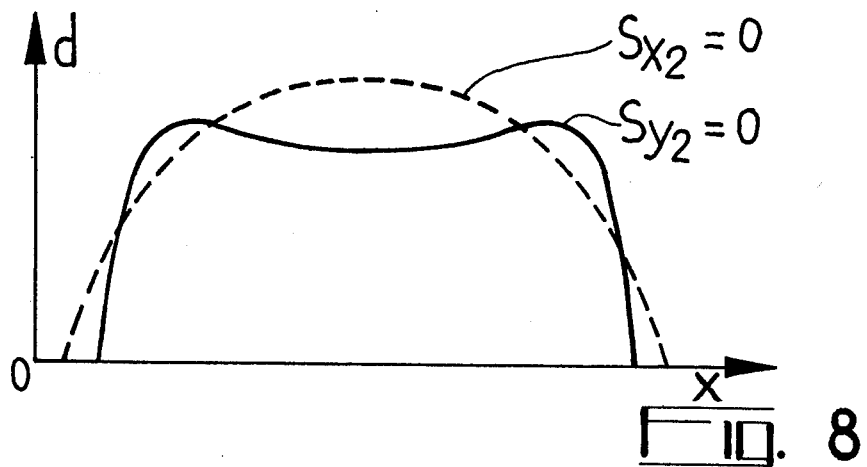
FIGS. 8 and 10 respectively illustrate the modulations in radiation dose level produced using the signals shown in FIGS. 7 and 9.

In another embodiment, the main and second quadripole systems can be connected in series and supplied from a single supply circuit. FIG. 7 illustrates the signals $S_{X1}$ and $S_{X2}$ which can be applied respectively to the quadripole systems $Q_1$ and $Q_2$ in this embodiment, whilst FIG. 8 illustrates the corresponding dose level modulation (full-line graph). The broken-line graph of FIG. 8 illustrates the dose level modulation obtained when the signals $S_{X2}$ and $S_{Y2}$ are zero.

Figure 9:
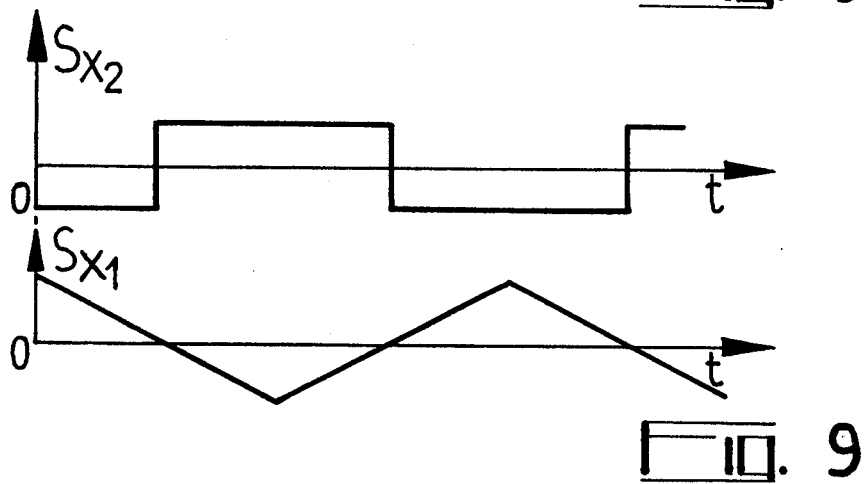
Figure 10:
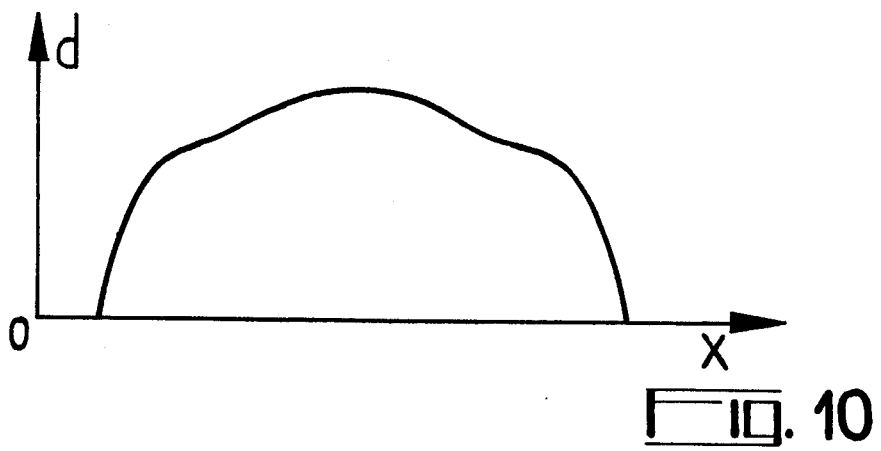

A modulation in dose level, or in other words density, which exhibits a peak at the center of the distribution curve, as in the case of FIG. 10, can be obtained by producing a 180° phase shift between the signals $S_{X1}$ and $S_{X2}$ respectively applied to the quadripole systems $Q_1$ and $Q_2$ (FIG. 9).

This kind of scanning device can advantageously be used to compensate for defects in the uniformity of bombardment of a target by a beam of charged particles (edge defects of the kind presented for example by scanning beams comprising low - energy electrons, or defects due to the beam collimation system).

This device, which is simple in design, is extremely flexible as far as its adjustment is concerned, and is highly reliable.

What we claim is:

1. A device for scanning a target with a beam of charged particles on both sides of an axis ZZ, said device comprising a main magnetic scanning system of axis ZZ, having a plurality of polepieces, each of said polepieces being associated with a coil, said main scanning system being associated with a secondary magnetic system located upstream of said main system along the axis ZZ and intended for variably offsetting said beam in relation to said axis ZZ before entering said main system, said secondary magnetic system having a plurality of polepieces, each of said polepieces being associated with a coil, means being provided for applying to said coils of the main and secondary multi-polar systems, electrical signals which have predetermined characteristics.

2. A scanning device as claimed in claim 1, wherein said main scanning system is a quadripole system so called main quadripole system, said secondary magnetic system is a quadripole system so called secondary quadripole system.

3. A scanning device as claimed in claim 2, wherein said coils of the polepieces of said main and secondary quadripole systems are supplied in pairs, in series, by a supply circuit.

4. A scanning device as claimed in claim 2, wherein said coils of the polepieces of said main and said secondary quadripole systems, are supplied by separate supply circuits.

5. A scanning device as claimed in claim 4, wherein said supply circuit of said main quadripole system comprises two generators followed by two amplifiers respectively feeding the two pairs of coils of said mutually opposite polepieces corresponding to the two channels $X_1$ and $Y_1$, and said supply circuit of said secondary quadripole system comprises two other generators followed by two amplifiers respectively supply the two pairs of coils of the mutually opposite polepieces corresponding to two channels $X_2$ and $Y_2$.

6. A scanning device as claimed in claim 5, wherein said two supply circuits respectively supply signals $S_{X1}$ and $S_{Y1}$ in the channels $X_1$ and $Y_1$, and signals $S_{X2}$ and $S_{Y2}$ in the channels $X_2$ and $Y_2$, said signals $S_{X1}$ and $S_{Y1}$ being sawtooth signals and said signals $S_{X2}$ and $S_{Y2}$ being squarewave signals of the same periodicity.

7. A scanning device as claimed in claim 6, wherein said signals $S_{X2}$ and $S_{Y2}$ are respectively in phase with said signals $S_{X1}$ and $S_{Y1}$.

8. A scanning device as claimed in claim 6, wherein said signals $S_{X2}$, $S_{Y2}$, are respectively in phase-opposition with said signals $S_{X1}$, $S_{Y1}$.

9. A scanning device as claimed in claim 3, wherein said supply circuit furnishes sawtooth signals, said signals applied to the coils of the mutually opposite polepieces belonging respectively to said main and secondary quadripole systems, being in phase with one another.

10. A scanning device as claimed in claim 3, wherein said supply circuit furnishes sawtooth signals, said signals applied to the coils of the mutually opposite polepieces belonging respectively to said main and secondary quadripole systems, being in phase-opposition with one another.

* * * * *